(12) United States Patent
Mutnury et al.

(10) Patent No.: US 11,835,576 B2
(45) Date of Patent: Dec. 5, 2023

(54) COMPENSATING FOR SIGNAL LOSS AT A PRINTED CIRCUIT BOARD

(71) Applicant: Dell Products L.P., Round Rock, TX (US)

(72) Inventors: Bhyrav M. Mutnury, Austin, TX (US); Sandor Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 204 days.

(21) Appl. No.: 17/647,857

(22) Filed: Jan. 13, 2022

(65) Prior Publication Data

US 2023/0221367 A1 Jul. 13, 2023

(51) Int. Cl.
*G01R 31/28* (2006.01)
*G01R 31/317* (2006.01)
*G06F 11/07* (2006.01)

(52) U.S. Cl.
CPC ........ *G01R 31/3171* (2013.01); *G06F 11/076* (2013.01); *G06F 11/0745* (2013.01); *G06F 11/0793* (2013.01)

(58) Field of Classification Search
CPC .......... G01R 31/3171; G01R 31/31709; G06F 11/0745; G06F 11/0793; G06F 11/076
See application file for complete search history.

(56) References Cited

U.S. PATENT DOCUMENTS

| | | | | |
|---|---|---|---|---|
| 7,492,816 | B1 * | 2/2009 | Wong | H04L 1/205 375/228 |
| 2003/0141942 | A1 * | 7/2003 | McMorrow | H05K 1/162 333/28 R |
| 2009/0238257 | A1 * | 9/2009 | Steinberger | H04B 3/50 375/230 |
| 2012/0223732 | A1 * | 9/2012 | Kobayashi | G01R 35/005 324/756.01 |

* cited by examiner

*Primary Examiner* — Thang X Le
(74) *Attorney, Agent, or Firm* — McDermott Will & Emery LLP (57) ABSTRACT

Compensating for signal loss, including determining a first expected loss at a first frequency and a second expected loss at a second frequency at a receiver associated with a first lane of a PCB; calculating an expected rate of change of signal loss between the first and the second frequencies based on the first and the second expected losses; calculating a first measured loss of a first signal transmitted at the first frequency and a second measured loss of a second signal transmitted at the second frequency from a transmitter to the receiver along the first lane of the PCB; calculating a measured rate of change of signal loss between the first and second frequencies based on the first and the second measured losses; comparing the measured rate of change with the expected rate of change; compensating a gain of a signal transmitted from the transmitter to the receiver.

20 Claims, 6 Drawing Sheets

COMPENSATING FOR SIGNAL LOSS AT A PRINTED CIRCUIT BOARD

BACKGROUND

Field of the Disclosure

The disclosure relates generally to compensating for signal loss at a printed circuit board.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As signal speeds in printed circuit boards (PCBs) continue to rise, parasitic effects can begin to have a large impact. For example, PCIe Gen5 speeds are sensitive to routing imperfections. PCB via stubs can adversely impact signal integrity as the stubs can resonate like antennas. Backdrilling can remove portions of the stubs; however, backdrilling can result in residual copper on the vias, termed via stripping.

SUMMARY

Innovative aspects of the subject matter described in this specification may be embodied in a method of compensating for signal loss, including determining a first expected loss at a first frequency at a receiver associated with a first lane of a printed circuit board (PCB); determining a second expected loss at a second frequency at the receiver associated with the first lane of the PCB; calculating an expected rate of change of signal loss between the first frequency and the second frequency based on the first expected loss and the second expected loss; calculating a first measured loss of a first signal transmitted at the first frequency from a transmitter to the receiver along the first lane of the PCB; calculating a second measured loss of a second signal transmitted at the second frequency from the transmitter to the receiver along the first lane of the PCB; calculating a measured rate of change of signal loss between the first frequency and the second frequency based on the first measured loss and the second measured loss; comparing the measured rate of change of signal loss with the expected rate of change of signal loss; and compensating, based on the comparison, a gain of a particular signal transmitted from the transmitter to the receiver.

Other embodiments of these aspects include corresponding systems, apparatus, and computer programs, configured to perform the actions of the methods, encoded on computer storage devices.

These and other embodiments may each optionally include one or more of the following features. For instance, comparing the measured rate of change of signal loss with the expected rate of change of signal loss further comprises determining a difference between the measured rate of change of the signal loss and the expected rate of change of the signal loss. Compensating the gain of the particular signal further includes increasing the gain of the particular signal based on the difference. Comparing the difference between the measure rate of change of the signal loss and the expected rate of change of the signal loss to a threshold; determining, based on the comparing, that the difference between the measure rate of change of the signal loss and the expected rate of change of the signal loss is less than the threshold; and in response to determining that the difference between the measure rate of change of the signal loss and the expected rate of change of the signal loss is less than the threshold, forgoing compensating the gain of the particular signal. Comparing the difference between the measure rate of change of the signal loss and the expected rate of change of the signal loss to a threshold; determining, based on the comparing, that the difference between the measure rate of change of the signal loss and the expected rate of change of the signal loss is greater than the threshold; and in response to determining that the difference between the measure rate of change of the signal loss and the expected rate of change of the signal loss is greater than the threshold, compensating the gain of the particular signal. The first signal is a max bit rate test signal. The second signal is a half bit rate test signal.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This disclosure discusses methods and systems for compensating for signal loss at a printed circuit board. Specifically, this disclosure discusses a system and a method for compensating for signal loss, including determining a first expected loss at a first frequency at a receiver associated with a first lane of a printed circuit board (PCB); determining a second expected loss at a second frequency at the receiver associated with the first lane of the PCB; calculating an expected rate of change of signal loss between the first frequency and the second frequency based on the first expected loss and the second expected loss; calculating a first measured loss of a first signal transmitted at the first frequency from a transmitter to the receiver along the first lane of the PCB; calculating a second measured loss of a second signal transmitted at the second frequency from the transmitter to the receiver along the first lane of the PCB; calculating a measured rate of change of signal loss between the first frequency and the second frequency based on the first measured loss and the second measured loss; comparing the measured rate of change of signal loss with the expected rate of change of signal loss; and compensating, based on the comparison, a gain of a particular signal transmitted from the transmitter to the receiver.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-6 wherein like numbers are used to indicate like and corresponding parts.

Figure 1:
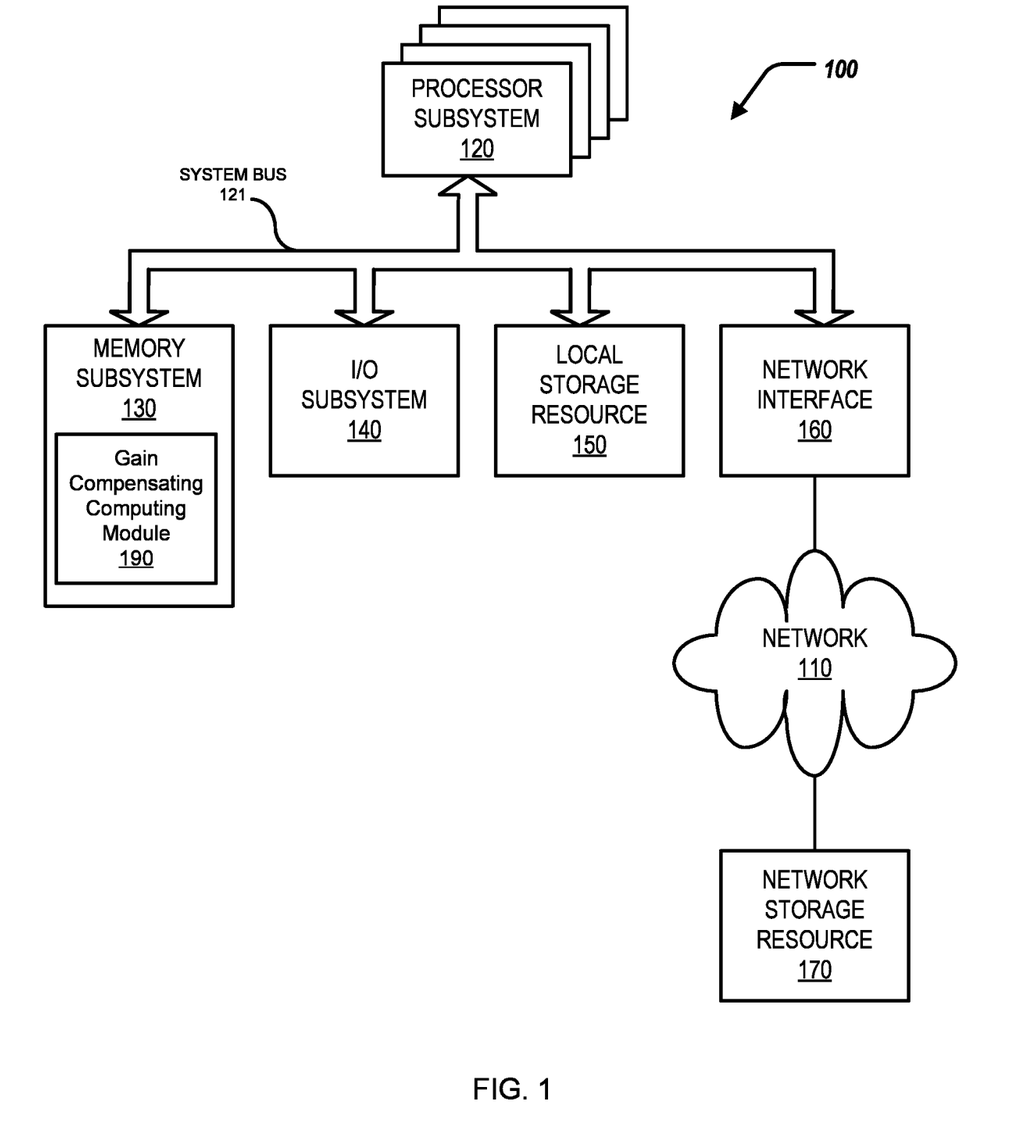
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can also include a gain compensation computing module 190. The gain compensation computing module 190 can be included by the memory subsystem 130. The gain compensation computing module 190 can include a computer-executable program (software). The gain compensation computing module 190 can be executed by the processor subsystem 120.

Figure 2:
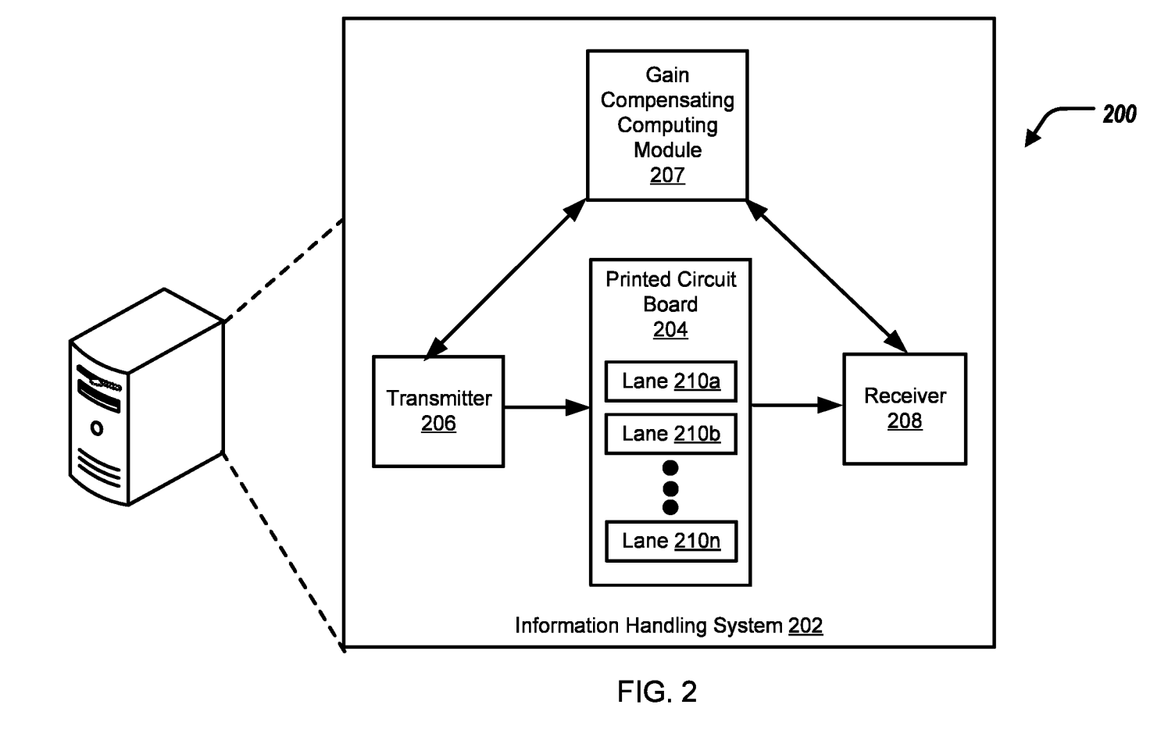
FIG. 2 illustrates a block diagram of a printed circuit board.

Turning to FIG. 2, FIG. 2 illustrates an environment 200 including an information handling system 202. The information handling system 202 can include a printed circuit board (PCB) 204, a transmitter 206, and a receiver 208. In some examples, the information handling system 202 is similar to, or includes, the information handling system 100 of FIG. 1. The transmitter 206 can be in communication with the receiver 208 through one or more lanes 210a, 210b, . . . , 210n (collectively referred to as lanes 210) of the PCB 204.

The information handling system 202 can further include a gain compensation computing module 207. The gain compensation computing module 207 can be in communication with the transmitter 206 and the receiver 208. In some examples, the gain compensation computing module 207 is similar to, or includes, the gain compensation computing module 190 of FIG. 1.

Figure 3:
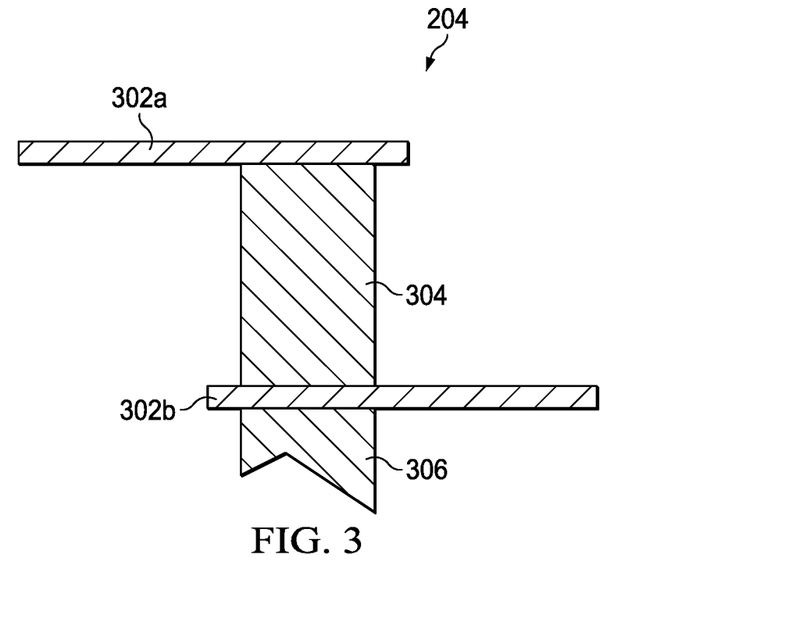
FIG. 3 illustrates a side view of the printed circuit board.

FIG. 3 illustrates a side view of the PCB 204. The PCB 204 can include a first trace 302a and a second trace 302b (collectively referred to as traces 302). The traces 302 can be connected by a via 304. A portion of the via 304 that is not removed by backdrilling is a stub 306 (via striping). A signal can be sent from the first trace 302a, to the via 304, and ultimately the second trade 302b (e.g., one of the lanes 210). However, a portion of the signal can be reflected by the stub 306.

In short, signal loss between the transmitter 206 and the receiver 208 may be suffered due to signal reflection by the stub 306. The signal loss can be determined between an expected loss and a measured loss; and further compensated based on such determination.

Figure 4:
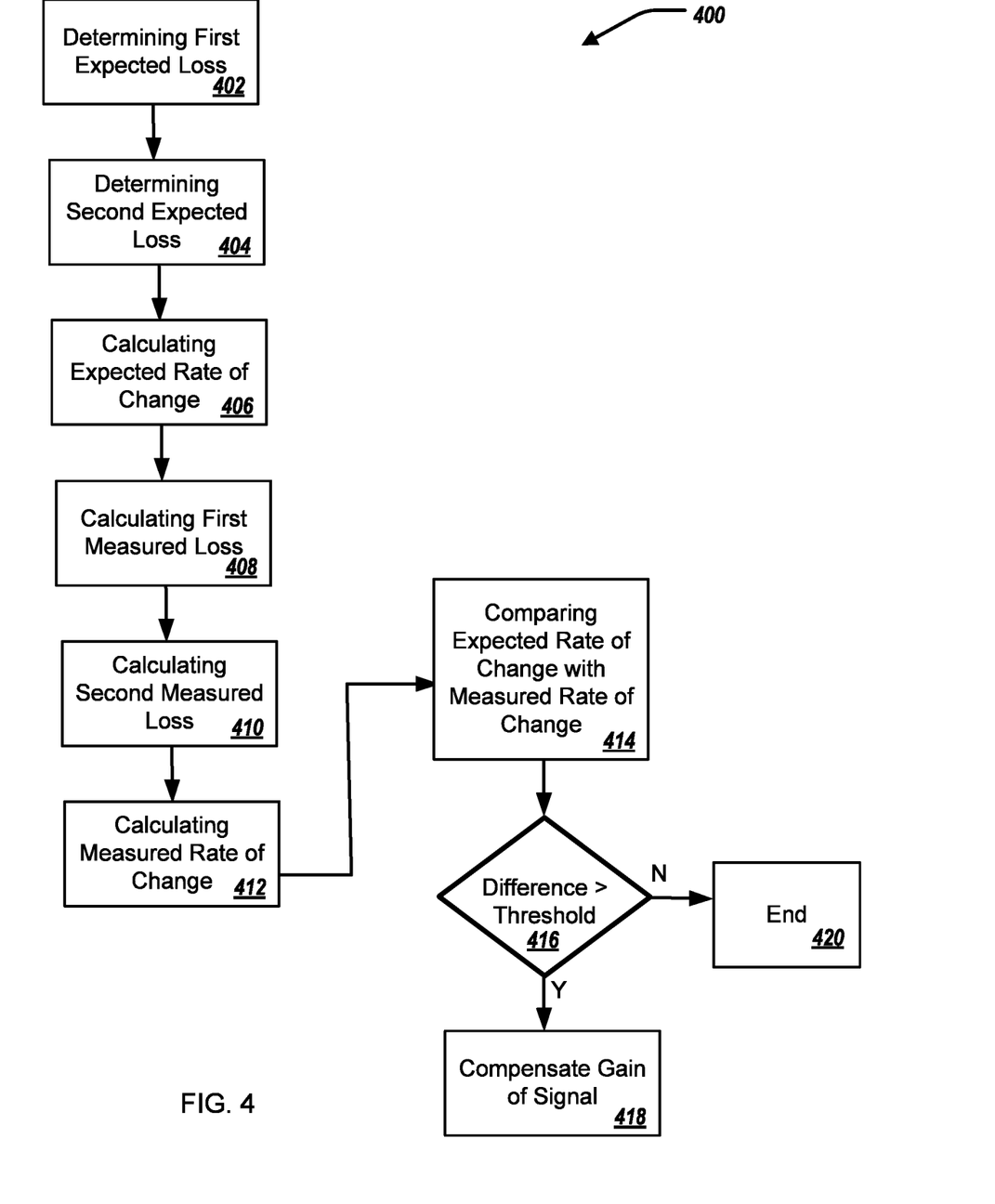
FIG. 4 illustrates a method for compensating for signal loss at the printed circuit board.

FIG. 4 illustrates a flowchart depicting selected elements of an embodiment of a method 400 for compensating for signal loss at the PCB 204. The method 400 may be performed by the information handling system 100, the information handling system 202, and/or the gain compensation computing module 207 and with reference to FIGS. 1-3. It is noted that certain operations described in method 400 may be optional or may be rearranged in different embodiments.

The gain compensating computing module 207 can determine a first expected loss at a first frequency at the receiver 208 associated with a first lane 210 of the PCB 204, at 402. The first expected loss at the first frequency at the receiver 208 associated with the first lane 210 can be based on design parameters of the PCB 204. The gain compensating computing module 207 can determine a second expected loss at a second frequency at the receiver 208 associated with the first lane 210 of the PCB 204, at 404. The second expected loss at the second frequency at the receiver 208 associated with the first lane 210 can be based on design parameters of the PCB 204.

Figure 5:
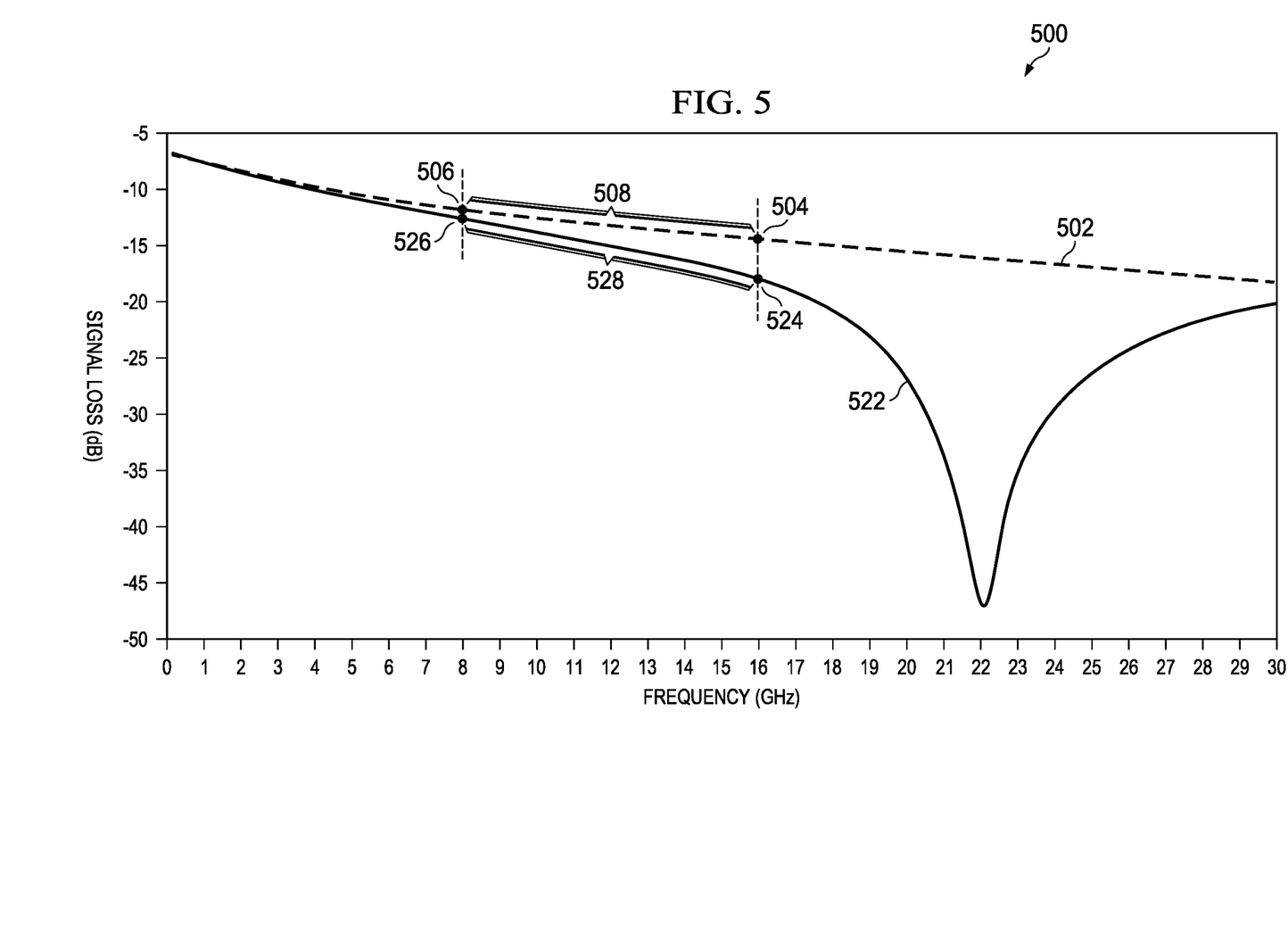
FIG. 5 illustrates a graph depicting expected signal loss and measured signal loss at the printed circuit board.

The gain compensating computing module 207 can calculate an expected rate of change of signal loss between the first frequency and the second frequency based on the first expected loss and the second expected loss, at 406. FIG. 5 illustrates a graph 500 depicting the expected signal loss at the PCB 204. In particular, the graph 500 illustrates an expected signal 502 that could be transmitted from the transmitter 206 to the receiver 208, and the expected signal loss/gain (dB on the y-axis) for varying frequencies (GHz on the x-axis) due to reflection of the signal by the stub 306.

In an example, for a stub (or stripe) 306 length of 0.1 millimeters (e.g. minimal stub as a result of proper backdrilling with minimal striping), at the first frequency (e.g., 16 GHz) indicated by a point 504 of the expected signal 502, the first expected loss is indicted (e.g., approximately −14.7 dB); and at the second frequency (e.g., 8 GHz) indicated by a point 506 of the expected signal 502, the second expected loss is indicated (e.g., approximately −12.1 dB). The gain compensating computing module 207 can calculate the expected rate of change of signal loss between the first frequency (e.g., 16 GHz) and the second frequency (e.g., 8 GHz) based on the first expected loss (e.g., approximately −14.7 dB) and the second expected loss (e.g., approximately −12.1 dB). For example, the expected rate of change of signal loss can be approximately −2.6 dB, shown by the segment 508 defined between the points 504, 506 (e.g., slope or linear approximation of the curve).

The gain compensating computing module 207 can calculate a first measured loss of a first signal transmitted at the first frequency from the transmitter 206 to the receiver 208 along the first lane 210 of the PCB 204, at 408. For example, the gain compensating computing module 207 can instruct the transmitter 206 to generate the first signal. In some examples, the first signal is a max bit rate test signal. In some examples, the signal is a 32 GT/s signal driving 01010101=16 GHz. The gain compensating computing module 207 can calculate the first measured loss of the first signal at the receiver 208, for example, measuring eye height and width, and converting to dB.

The gain compensating computing module 207 can calculate a second measured loss of a second signal transmitted at the second frequency from the transmitter 206 to the receiver 208 along the first lane 210 of the PCB 204, at 410. For example, the gain compensating computing module 207 can instruct the transmitter 206 to generate the second signal. In some examples, the second signal is a half bit rate test signal. In some examples, the signal is a 32 GT/s signal driving 00110011=8 GHz. The gain compensating computing module 207 can calculate the second measured loss of the second signal at the receiver 208, for example, measuring eye height and width, and converting to dB.

The gain compensating computing module 207 can calculate a measured rate of change of signal loss between the first frequency and the second frequency based on the first measured loss and the second measured loss, at 412. FIG. 5 illustrates the graph 500 depicting the measured signal loss at the PCB 204. In particular, the graph 500 further illustrates a measured signal 522 that could be transmitted from the transmitter 206 to the receiver 208, and the expected signal loss/gain (dB on the y-axis) for varying frequencies (GHz on the x-axis) due to reflection of the signal by the stub 306.

In an example, for a stub (or stripe) 306 length of 2 millimeters, at the first frequency (e.g., 16 GHz) indicated by a point 524 at the measured signal 522, the first expected loss is indicted (e.g., approximately −18 dB); and at the second frequency (e.g., 8 GHz) indicated by a point 526 at the measured signal 522, the second expected loss is indicated (e.g., approximately −12.5 dB). The gain compensating computing module 207 can calculate the measured rate of change of signal loss between the first frequency (e.g., 16 GHz) and the second frequency (e.g., 8 GHz) based on the first measured loss (e.g., approximately −18 dB) and the second measured loss (e.g., approximately −12.5 dB). For example, the measured rate of change of signal loss can be approximately −5.5 dB, shown by the segment 528 defined between the points 524, 526 (e.g., slope or linear approximation of the curve).

The gain compensating computing module 207 can compare the measured rate of change of signal loss with the expected rate of change of signal loss, at 414. In some examples, when the gain compensating computing module 207 compares the measured rate of change of signal loss with the expected rate of change of signal loss, the gain compensating computing module 207 determines a difference between the measured rate of change of the signal loss and the expected rate of change of the signal loss. Continuing the example, the expected rate of change of signal loss is approximately −2.6 dB and the measured rate of change of signal loss is approximately −5.5 dB, for a difference of approximately 2.9 dB.

The gain compensating computing module 207 can compare the difference between the measured rate of change of the signal loss and the expected rate of change of the signal loss with a threshold, at 416.

Figure 6:
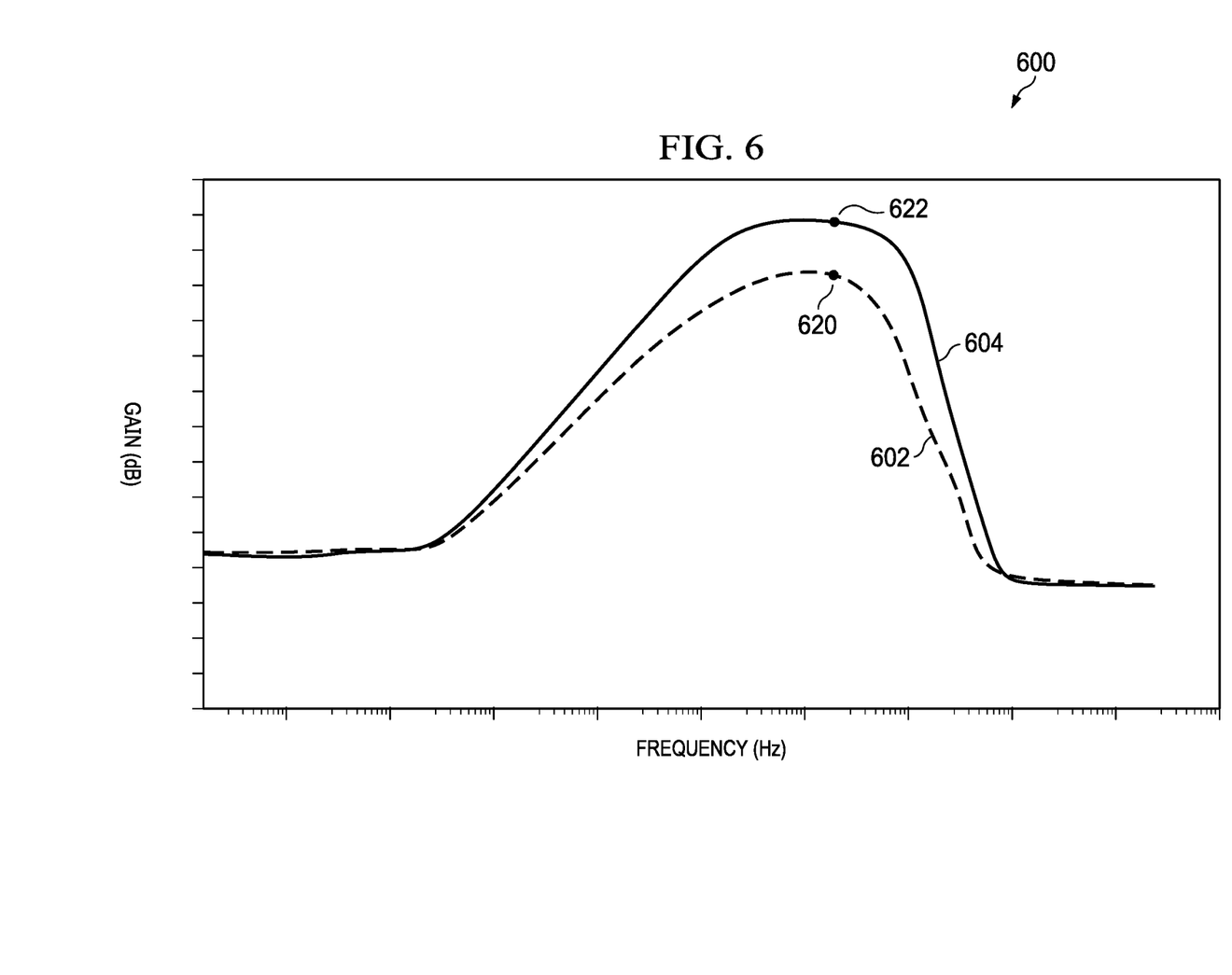
FIG. 6 illustrates a graph depicting signal compensation at the printed circuit board.

In some examples, when the difference between the measured rate of change of the signal loss and the expected rate of change of the signal loss is greater than a threshold, the gain compensating computing module 207 can compensate, based on the comparison, a gain of a signal transmitted from the transmitter 206 to the receiver 208, at 418. Specifically, the gain compensating computing module 207 can compensate the gain of the signal by increasing the gain of the signal based on the difference. FIG. 6 illustrates a graph 600 depicting signal compensation at the PCB 204. In particular, the graph 600 illustrates a gain 602 of the signal that is transmitted from the transmitter 206 the receiver 208, and the expected gain (dB on the y-axis) for varying frequencies (GHz on the x-axis). Continuing the example, the gain compensating computing module 207 can compensate the gain of the signal by increasing the gain of the signal based on the difference, e.g., by 2.9 dB, shown by the gain between point 620 of the gain 602 and the point 622 on the gain 604 at the first frequency (e.g., 16 GHz).

In some examples, when the difference between the measured rate of change of the signal loss and the expected rate of change of the signal loss is less than a threshold, the gain compensating computing module 207 can forgo compensating the gain of the signal, at 420.

In some examples, the method 400 can be repeated for each of the lanes 210, concurrently, sequentially, or in any combination.

In some examples, the gain compensating computing module 207 can compare the rate of change of signal loss between two measured signals. When the gain compensating computing module 207 compares the rate of change of signal loss between two measured signals, the gain compensating computing module 207 determines a difference therebetween. The gain compensating computing module 207 can compare the difference between the rate of change of the signal loss of the measured signals with a threshold. When the difference between the rate of change of the signal loss of the measured signal is greater than a threshold, the gain compensating computing module 207 can compensate, based on the comparison, a gain of the measured signal having a greater signal loss. For example, the gain compensating computing module 207 can compensate the gain of the measured signal having the greater signal loss by increasing the gain of the signal based on the difference.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method of compensating for signal loss, the method comprising:
   determining a first expected loss at a first frequency at a receiver associated with a first lane of a printed circuit board (PCB);
   determining a second expected loss at a second frequency at the receiver associated with the first lane of the PCB;
   calculating an expected rate of change of signal loss between the first frequency and the second frequency based on the first expected loss and the second expected loss;
   calculating a first measured loss of a first signal transmitted at the first frequency from a transmitter to the receiver along the first lane of the PCB;
   calculating a second measured loss of a second signal transmitted at the second frequency from the transmitter to the receiver along the first lane of the PCB;
   calculating a measured rate of change of signal loss between the first frequency and the second frequency based on the first measured loss and the second measured loss;
   comparing the measured rate of change of signal loss with the expected rate of change of signal loss; and
   compensating, based on the comparison, a gain of a particular signal transmitted from the transmitter to the receiver.

2. The method of claim 1, wherein comparing the measured rate of change of signal loss with the expected rate of change of signal loss further comprises determining a difference between the measured rate of change of the signal loss and the expected rate of change of the signal loss.

3. The method of claim 2, wherein compensating the gain of the particular signal further includes increasing the gain of the particular signal based on the difference.

4. The method of claim 2, further comprising:
   comparing the difference between the measure rate of change of the signal loss and the expected rate of change of the signal loss to a threshold;
   determining, based on the comparing, that the difference between the measure rate of change of the signal loss and the expected rate of change of the signal loss is less than the threshold; and
   in response to determining that the difference between the measure rate of change of the signal loss and the expected rate of change of the signal loss is less than the threshold, forgoing compensating the gain of the particular signal.

5. The method of claim 2, further comprising:
   comparing the difference between the measure rate of change of the signal loss and the expected rate of change of the signal loss to a threshold;
   determining, based on the comparing, that the difference between the measure rate of change of the signal loss and the expected rate of change of the signal loss is greater than the threshold; and
   in response to determining that the difference between the measure rate of change of the signal loss and the expected rate of change of the signal loss is greater than the threshold, compensating the gain of the particular signal.

6. The method of claim 1, wherein the first signal is a max bit rate test signal.

7. The method of claim 1, wherein the second signal is a half bit rate test signal.

8. An information handling system comprising a processor having access to memory media storing instructions executable by the processor to perform operations, comprising:
   determining a first expected loss at a first frequency at a receiver associated with a first lane of a printed circuit board (PCB);
   determining a second expected loss at a second frequency at the receiver associated with the first lane of the PCB;
   calculating an expected rate of change of signal loss between the first frequency and the second frequency based on the first expected loss and the second expected loss;
   calculating a first measured loss of a first signal transmitted at the first frequency from a transmitter to the receiver along the first lane of the PCB;
   calculating a second measured loss of a second signal transmitted at the second frequency from the transmitter to the receiver along the first lane of the PCB;
   calculating a measured rate of change of signal loss between the first frequency and the second frequency based on the first measured loss and the second measured loss;
   comparing the measured rate of change of signal loss with the expected rate of change of signal loss; and
   compensating, based on the comparison, a gain of a particular signal transmitted from the transmitter to the receiver.

9. The information handling system of claim 8, wherein comparing the measured rate of change of signal loss with the expected rate of change of signal loss further comprises determining a difference between the measured rate of change of the signal loss and the expected rate of change of the signal loss.

10. The information handling system of claim 9, wherein compensating the gain of the particular signal further includes increasing the gain of the particular signal based on the difference.

11. The information handling system of claim 9, the operations further comprising:
comparing the difference between the measure rate of change of the signal loss and the expected rate of change of the signal loss to a threshold;
determining, based on the comparing, that the difference between the measure rate of change of the signal loss and the expected rate of change of the signal loss is less than the threshold; and
in response to determining that the difference between the measure rate of change of the signal loss and the expected rate of change of the signal loss is less than the threshold, forgoing compensating the gain of the particular signal.

12. The information handling system of claim 9, the operations further comprising:
comparing the difference between the measure rate of change of the signal loss and the expected rate of change of the signal loss to a threshold;
determining, based on the comparing, that the difference between the measure rate of change of the signal loss and the expected rate of change of the signal loss is greater than the threshold; and
in response to determining that the difference between the measure rate of change of the signal loss and the expected rate of change of the signal loss is greater than the threshold, compensating the gain of the particular signal.

13. The information handling system of claim 8, wherein the first signal is a max bit rate test signal.

14. The information handling system of claim 8, wherein the second signal is a half bit rate test signal.

15. A non-transitory computer-readable medium storing software comprising instructions executable by one or more computers which, upon such execution, cause the one or more computers to perform operations comprising:
determining a first expected loss at a first frequency at a receiver associated with a first lane of a printed circuit board (PCB);
determining a second expected loss at a second frequency at the receiver associated with the first lane of the PCB;
calculating an expected rate of change of signal loss between the first frequency and the second frequency based on the first expected loss and the second expected loss;
calculating a first measured loss of a first signal transmitted at the first frequency from a transmitter to the receiver along the first lane of the PCB;
calculating a second measured loss of a second signal transmitted at the second frequency from the transmitter to the receiver along the first lane of the PCB;
calculating a measured rate of change of signal loss between the first frequency and the second frequency based on the first measured loss and the second measured loss;
comparing the measured rate of change of signal loss with the expected rate of change of signal loss; and
compensating, based on the comparison, a gain of a particular signal transmitted from the transmitter to the receiver.

16. The computer-readable medium of claim 15, wherein comparing the measured rate of change of signal loss with the expected rate of change of signal loss further comprises determining a difference between the measured rate of change of the signal loss and the expected rate of change of the signal loss.

17. The computer-readable medium of claim 16, wherein compensating the gain of the particular signal further includes increasing the gain of the particular signal based on the difference.

18. The computer-readable medium of claim 16, the operations further comprising:
comparing the difference between the measure rate of change of the signal loss and the expected rate of change of the signal loss to a threshold;
determining, based on the comparing, that the difference between the measure rate of change of the signal loss and the expected rate of change of the signal loss is less than the threshold; and
in response to determining that the difference between the measure rate of change of the signal loss and the expected rate of change of the signal loss is less than the threshold, forgoing compensating the gain of the particular signal.

19. The computer-readable medium of claim 16, the operations further comprising:
comparing the difference between the measure rate of change of the signal loss and the expected rate of change of the signal loss to a threshold;
determining, based on the comparing, that the difference between the measure rate of change of the signal loss and the expected rate of change of the signal loss is greater than the threshold; and
in response to determining that the difference between the measure rate of change of the signal loss and the expected rate of change of the signal loss is greater than the threshold, compensating the gain of the particular signal.

20. The computer-readable medium of claim 15, wherein the first signal is a max bit rate test signal.

* * * * *